(12) United States Patent
Remez et al.

(10) Patent No.: US 11,994,694 B2
(45) Date of Patent: May 28, 2024

(54) MICROLENS ARRAY WITH TAILORED SAG PROFILE

(71) Applicant: Apple Inc., Cupertino, CA (US)

(72) Inventors: Roei Remez, Tel Aviv (IL); Keith Lyon, San Jose, CA (US); Niv Gilboa, Raanana (IL); Ronen Akerman, Sunnyvale, CA (US); Scott T. Smith, San Jose, CA (US)

(73) Assignee: APPLE INC., Cupertino, CA (US)

( * ) Notice: Subject to any disclaimer, the term of this patent is extended or adjusted under 35 U.S.C. 154(b) by 213 days.

(21) Appl. No.: 17/509,001

(22) Filed: Oct. 24, 2021

(65) Prior Publication Data

US 2022/0229210 A1 Jul. 21, 2022

Related U.S. Application Data

(60) Provisional application No. 63/138,469, filed on Jan. 17, 2021.

(51) Int. Cl.
*G02B 3/00* (2006.01)
*G02B 3/02* (2006.01)
(Continued)

(52) U.S. Cl.
CPC ............ *G02B 3/0037* (2013.01); *G02B 3/02* (2013.01); *G03B 21/2033* (2013.01);
(Continued)

(58) Field of Classification Search
None
See application file for complete search history.

(56) References Cited

U.S. PATENT DOCUMENTS

| 6,751,379 B2 | 6/2004 | Capewell et al. |
| 7,257,141 B2 | 8/2007 | Chua |

(Continued)

FOREIGN PATENT DOCUMENTS

| CN | 102709808 A | 10/2012 |
| CN | 103412406 A | 11/2013 |

(Continued)

OTHER PUBLICATIONS

Zhan et al., "Confined Etchant Layer Technique (CELT) for Micromanufacture," Proceedings of the 6th IEEE International Conference on Nano/Micro Engineered and Molecular Systems, pp. 863-867, Feb. 20-23, 2011.

(Continued)

*Primary Examiner* — Bao-Luan Q Le
*Assistant Examiner* — Danell L Owens
(74) *Attorney, Agent, or Firm* — KLIGLER & ASSOCIATES PATENT ATTORNEYS LTD.

(57) ABSTRACT

An optical device includes a first array of emitters disposed on a substrate and configured to emit respective beams of optical radiation in a direction perpendicular to the substrate. A second array of microlenses is positioned on the substrate in alignment with the respective beams of the emitters, having respective sag profiles that vary over an area of the substrate. The second array includes at least first microlenses in a central region of the substrate and second microlenses in a peripheral region of the substrate, such that the first microlenses have respective first focal powers, while the second microlenses have respective second focal powers, which are less than the first focal powers.

19 Claims, 4 Drawing Sheets

(51) Int. Cl.
*G03B 21/20* (2006.01)
*H01S 5/02253* (2021.01)
*H01S 5/183* (2006.01)
*H01S 5/323* (2006.01)
*H01S 5/42* (2006.01)

(52) U.S. Cl.
CPC ........ *G03B 21/208* (2013.01); *H01S 5/02253* (2021.01); *H01S 5/18305* (2013.01); *H01S 5/423* (2013.01); *G02B 2003/0093* (2013.01); *H01S 5/32316* (2013.01)

(56) References Cited

U.S. PATENT DOCUMENTS

| | | | |
|---|---|---|---|
| 7,825,423 | B2 | 11/2010 | Shiraishi et al. |
| 8,526,476 | B2 | 9/2013 | Engl et al. |
| 8,783,893 | B1 | 7/2014 | Seurin |
| 9,048,633 | B2 | 6/2015 | Gronenborn et al. |
| 9,112,330 | B2 | 8/2015 | Gronenborn et al. |
| 9,553,423 | B2 | 1/2017 | Chen et al. |
| 9,746,369 | B2 | 8/2017 | Shpunt et al. |
| 10,072,815 | B2 | 9/2018 | MacKinnon et al. |
| 10,295,145 | B2 | 5/2019 | MacKinnon et al. |
| 11,025,898 | B2 | 6/2021 | Avraham et al. |
| 2002/0048292 | A1 | 4/2002 | Bissinger et al. |
| 2003/0011888 | A1* | 1/2003 | Cox ............... G02B 6/138 257/E31.128 |
| 2003/0026310 | A1 | 2/2003 | Valliath |
| 2004/0070706 | A1 | 4/2004 | Freeman |
| 2004/0070855 | A1 | 4/2004 | Benitez et al. |
| 2004/0130790 | A1 | 7/2004 | Sales |
| 2004/0184155 | A1 | 9/2004 | Kornblit et al. |
| 2006/0045144 | A1 | 3/2006 | Karlsen et al. |
| 2006/0066192 | A1 | 3/2006 | Beeson et al. |
| 2007/0071056 | A1 | 3/2007 | Chen |
| 2008/0054281 | A1 | 3/2008 | Narendran et al. |
| 2008/0267232 | A1 | 10/2008 | DeNatale |
| 2009/0032511 | A1 | 2/2009 | Adams et al. |
| 2009/0161033 | A1 | 6/2009 | Kaise |
| 2010/0019136 | A1 | 1/2010 | Merenda et al. |
| 2010/0171866 | A1* | 7/2010 | Brady ............... H04N 23/55 348/340 |
| 2010/0208763 | A1 | 8/2010 | Engl et al. |
| 2011/0019048 | A1 | 1/2011 | Raynor et al. |
| 2012/0147912 | A1 | 6/2012 | Moench et al. |
| 2012/0248977 | A1 | 10/2012 | Ootorii |
| 2013/0266326 | A1 | 10/2013 | Joseph et al. |
| 2013/0329429 | A1 | 12/2013 | Lowes et al. |
| 2013/0334559 | A1 | 12/2013 | Vdovin et al. |
| 2015/0092802 | A1 | 4/2015 | Gronenborn et al. |
| 2015/0340841 | A1 | 11/2015 | Joseph |
| 2016/0164261 | A1 | 6/2016 | Warren |
| 2017/0033535 | A1 | 2/2017 | Joseph |
| 2018/0038944 | A1 | 2/2018 | Hellmig et al. |
| 2018/0041755 | A1 | 2/2018 | Fettig et al. |
| 2019/0052365 | A1 | 2/2019 | Joseph et al. |
| 2019/0273906 | A1 | 9/2019 | Xiao et al. |
| 2019/0312413 | A1 | 10/2019 | Sirbu et al. |
| 2019/0363520 | A1 | 11/2019 | Laflaquiere et al. |
| 2020/0057145 | A1 | 2/2020 | Townsend et al. |
| 2020/0081165 | A1 | 3/2020 | Avraham et al. |
| 2020/0169061 | A1 | 5/2020 | Mitomo et al. |
| 2020/0194973 | A1 | 6/2020 | Bloemen et al. |
| 2020/0194975 | A1 | 6/2020 | Gronenborn et al. |
| 2020/0209729 | A1 | 7/2020 | Chen et al. |
| 2020/0251882 | A1 | 8/2020 | Lyon et al. |
| 2020/0350744 | A1 | 11/2020 | Gerlach |
| 2020/0367967 | A1* | 11/2020 | Lee ............... G02B 27/0961 |
| 2021/0013703 | A1 | 1/2021 | Numata et al. |
| 2021/0351561 | A1 | 11/2021 | Lyon |

FOREIGN PATENT DOCUMENTS

| | | |
|---|---|---|
| CN | 106990659 A | 7/2017 |
| DE | 102007029370 A1 | 11/2008 |
| EP | 0488772 A1 | 6/1992 |
| JP | 09061610 A1 | 3/1997 |
| JP | 2012181243 A | 9/2012 |
| WO | 2010067261 A1 | 6/2010 |
| WO | 2016131658 A1 | 8/2016 |
| WO | 2018053378 A1 | 3/2018 |
| WO | 2019181757 A1 | 9/2019 |

OTHER PUBLICATIONS

Gimkiewicz et al., "Fabrication of microprisms for planar optical interconnections by use of analog gray-scale lithography with high-energy-beam-sensitive glass", Applied Optics, vol. 38, No. 14, pp. 2986-2990, May 10, 1999.
U.S. Appl. No. 16/779,609 Office Action dated May 26, 2022.
KR Application # 10-2020-7017879 Office Action dated Aug. 18, 2022.
CN Application # 202080010535.0 Office Action dated Sep. 20, 2023.
U.S. Appl. No. 17/233,489 Office Action dated Sep. 20, 2023.
U.S. Appl. No. 17/233,489 Office Action dated Feb. 2, 2024.

* cited by examiner

MICROLENS ARRAY WITH TAILORED SAG PROFILE

CROSS-REFERENCE TO RELATED APPLICATION

This application claims the benefit of U.S. Provisional Patent Application 63/138,469, filed Jan. 17, 2021, which is incorporated herein by reference.

FIELD OF THE INVENTION

The present invention relates generally to optoelectronic devices, and specifically to devices and methods for generating an array of optical beams.

BACKGROUND

In optics, the term "sag" (short for sagitta) is a measure of the shape of an optical element. (Traditionally, the sag expresses the amount of material to be removed from a transparent blank in order to create a given spherical or aspheric lens form.) The sag profile of a lens specifies the surface shape of the lens in terms of the elevation z as a function of the transverse dimensions. It can be expressed in polar coordinates $(r,\theta)$, relative to a center point at the origin, as $z=S(r,\theta)=f(r)+g(r,\theta)$.

The sag thus specifies how a lens will modify a transmitted beam of optical radiation by determining the direction of rays refracted at its surface (or alternatively the phase that the beam accumulates). Generally speaking, any sag can be manufactured. The axially-symmetric spherical component f of the sag expresses the focal power of the lens; other radially-symmetrical components can induce spherical aberrations; and non-symmetrical components g can correspond to the astigmatism, coma, and tilt of the beam, as well as other non-radial contributions. In the context of the present description and in the claims, the terms "optical" and "light" refer to electromagnetic radiation in any of the visible, infrared, and ultraviolet ranges of the spectrum. The term "focal power" is used interchangeably with the term "optical power" to mean the degree to which an optical element converges or diverges a beam of light. For lenses, the focal power is the reciprocal of the focal length and is commonly expressed in diopters. It has a positive value for converging lenses and a negative power for diverging lenses.

SUMMARY

Embodiments of the present invention that are described hereinbelow provide improved microlens arrays and optical systems based on such arrays.

There is therefore provided, in accordance with an embodiment of the invention, an optical device, including a first array of emitters disposed on a substrate and configured to emit respective beams of optical radiation in a direction perpendicular to the substrate. A second array of microlenses is positioned on the substrate in alignment with the respective beams of the emitters. The microlenses have respective sag profiles that vary over an area of the substrate. The second array includes at least first microlenses in a central region of the substrate and second microlenses in a peripheral region of the substrate, such that the first microlenses have respective first focal powers, while the second microlenses have respective second focal powers, which are less than the first focal powers.

In a disclosed embodiment the sag profiles are defined such that the microlenses have respective focal powers that decrease gradually from the first focal powers to the second focal powers in a radial direction over the area of the substrate. Additionally or alternatively, the first focal powers are positive, while the second focal powers are negative.

In some embodiments, the sag profiles define respective tilt angles of the microlenses, and the tilt angles vary over the area of the substrate. In one embodiment, the tilt angles are greater in the peripheral region of the substrate than in the central region, whereby the microlenses refract the beams toward a central axis.

In some embodiments, the substrate includes a semiconductor chip, which is transparent to the optical radiation emitted by the emitters, and the emitters are disposed on a first surface of the semiconductor chip and emit the respective beams through the substrate, while the microlenses are disposed on a second surface of the semiconductor chip, opposite the first substrate. In one embodiment, the microlenses are defined by a pattern of recesses etched into the second surface of the semiconductor chip. Alternatively, the emitters are disposed on a surface of the semiconductor chip and emit the respective beams in a direction away from the substrate, while the microlenses are disposed over the emitters. In a disclosed embodiment, the emitters include vertical-cavity surface-emitting lasers (VCSELs).

In some embodiments, the sag profiles are chosen such that the respective beams transmitted through the microlenses have respective foci that lie on a geometrical surface that is not flat. In one embodiment, the geometrical surface is curved. Additionally or alternatively, the projection optics have an object plane that is not flat and coincides with the curved geometrical surface. In a disclosed embodiment, the projection optics are configured to collimate the beams that have been transmitted through the microlenses. Alternatively, the projection optics include a diverging lens. In one embodiment, the projection optics include a plastic singlet.

In a disclosed embodiment, the device includes projection optics, which are configured to collimate the beams that have been transmitted through the microlenses, and the respective sag profiles define an astigmatism of the microlenses that corrects for an aberration of the projection optics.

There is also provided, in accordance with an embodiment of the invention, a method for producing an optical device. The method includes forming a first array of emitters on a substrate so that the emitters emit respective beams of optical radiation in a direction perpendicular to the substrate. A second array of microlenses is positioned on the substrate in alignment with the respective beams of the emitters. The microlenses have respective sag profiles that vary over an area of the substrate. The second array includes at least first microlenses in a central region of the substrate and second microlenses in a peripheral region of the substrate, such that the first microlenses have respective first focal powers, while the second microlenses have respective second focal powers, which are less than the first focal powers.

The present invention will be more fully understood from the following detailed description of the embodiments thereof, taken together with the drawings in which:

DETAILED DESCRIPTION OF EMBODIMENTS

Figure 1A:
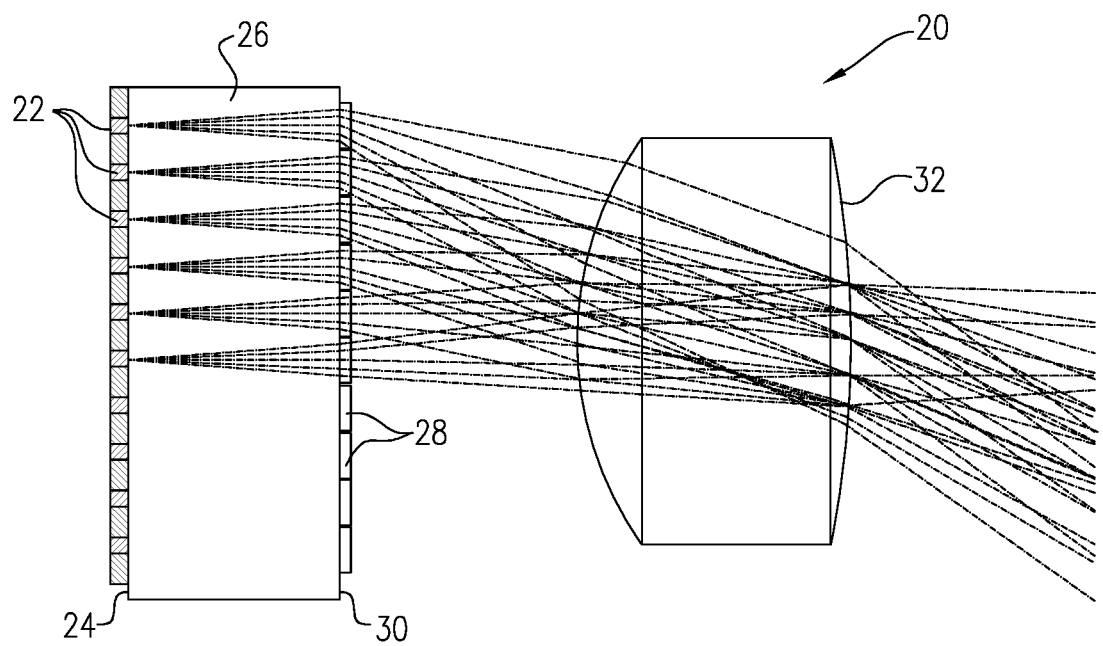
FIG. 1A is a schematic side view of a multi-beam optical projector, in accordance with an embodiment of the invention.

Typical arrays of emitters on a semiconductor substrate, such as one- or two-dimensional arrays of vertical-cavity surface-emitting lasers (VCSELs), emit beams in a direction perpendicular to the surface of the substrate. In some applications, such as projection of structured light patterns for purposes of depth sensing, beam conditioning, or imaging, lenses are positioned over the emitter array in order to project the desired far-field illumination pattern. The lenses are required to capture the angular emission of each emitter, while also achieving good focal performance in the far field. Costly and complex lens systems may be required in order to achieve the desired beam quality.

Integrated microlens arrays can be useful in improving the far-field beam pattern and reducing the burden on the projection optics in optical projection devices. In this case, an array of microlenses is positioned on the substrate in alignment with the respective beams from the emitters, so that each microlens receives and refracts the beam from a corresponding emitter. For example, when the substrate is transparent to the radiation emitted by the emitters, the emitters may be formed on one surface of the substrate and emit their respective beams through the substrate, while the microlenses are formed on the opposite surface. The microlenses transmit and focus the beams toward the projection optics. Because of the small dimensions of the emitter array and the short object distance between the emitters and the microlenses, however, the effectiveness of the microlenses in improving the output beam quality is limited, particularly due to diffraction, which is high when the microlens diameter is small.

Embodiments of the present invention that are described herein address the limitations of existing microlens arrays and projection optics by providing microlens arrays with sag profiles that vary over the area of the substrate on which the microlenses are formed. These sag variations can be designed in conjunction with the projection optics in order to give optimal overall quality of the projected beams, even when simple optical elements, such as plastic singlets, are used for projection. For this purpose, the variations in sag profile over the microlens array can be chosen so that the optical properties of the microlenses—such as focal power, tilt, astigmatism and/or other aberrations—vary among the microlenses.

In some embodiments, the sag profiles of the lenses are defined such that the microlenses in the central region of substrate have a certain focal power, while the microlenses in a peripheral region of the substrate have a lower focal power. Specifically, the sag profile is typically defined so that the focal powers of the microlenses decrease gradually in a radial direction over the area of the microlens array from the central region out to the peripheral region. In one such embodiment, the focal power in the central region is positive (i.e., the microlenses converge the beams of the respective emitters in the central region), while that in the peripheral region is negative (diverging the beams of the emitters in the peripheral region).

Additionally or alternatively, the sag profiles of the microlenses define respective tilt angles of the microlenses, which vary over the area of the substrate. For example, the tilt angles in the peripheral region may be chosen so that the microlenses refract the respective beams either toward or away from a central axis of the projection device.

The varying sag profiles of the microlenses can be designed in conjunction with the projection optics in order to optimize the far-field performance of the device. In one embodiment, the sag profiles are chosen such that the respective beams transmitted through the microlenses have respective foci that lie on a curved or otherwise non-flat geometrical surface, which coincides with a curved object plane of the projection optics. (The term "geometrical surface" is used in the present description and in the claims to refer to a two- or three-dimensional locus in space, which may be of arbitrary shape and need not coincide with any actual physical surface.) Additionally or alternatively, the sag profiles may be designed to compensate for aberrations of the projection optics and thus may define, for example, an astigmatism that varies over the area of the substrate. As noted earlier, the sag profiles can be optimized in conjunction with the optimization of the optical surfaces of the projection optics to provide a high-quality output beam (or an array of beams, emitted respectively from an array of emitters), even when the projection optics comprise only a simple, molded plastic singlet.

Figure 1B:
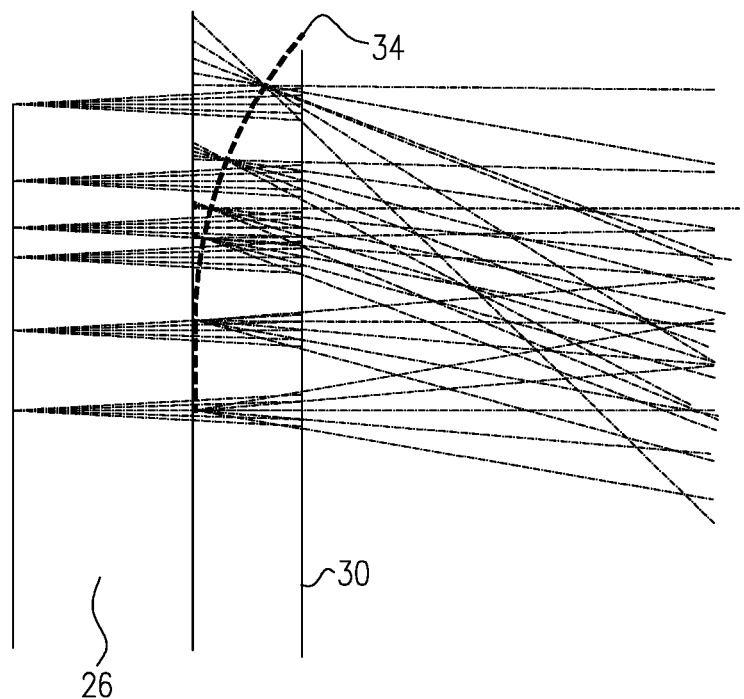
FIG. 1B is an optical ray trace of a part of the projector of FIG. 1A.

Reference is now made to FIGS. 1A and 1B, which schematically illustrate a multi-beam optical projector 20, in accordance with an embodiment of the invention. FIG. 1A is a side view of projector 20, while FIG. 1B is an optical ray trace of a part of the projector. This sort of projector can be used, inter alia, in projecting a pattern of spots onto a target scene, for example to serve as a structured-light pattern in a depth mapping system, as is known in the art. Alternatively, this sort of optical scheme can be used in other applications requiring projection of a light beam or beams with high optical quality, such as projectors for time-of-flight sensing.

Projector 20 comprises an array of emitters, for example back-emitting VCSELs 22, which are formed on a front surface 24 of a semiconductor substrate 26, using VCSEL fabrication processes that are known in the art. (The terms "front" and "rear" are used arbitrarily in the present description, for the sake of convenience, to distinguish between the two sides of the substrate.) VCSELs 22 emit respective beams through substrate 26 in a direction perpendicular to the substrate, i.e., with respective optical axes that are normal to surface 24. In this example, substrate 26 comprises a GaAs chip, which is transparent to the radiation emitted by the VCSELs.

An array of on-chip microlenses 28 is formed on a back surface 30 of substrate 26 in alignment with respective VCSELs 22. Microlenses 28 can be formed, for example, by a process of gray-scale lithography, as is known in the art, whereby the microlenses are defined by a pattern of recesses etched into surface 30 (such as the pattern shown in FIG. 2C). This approach is advantageous because the high refractive index of GaAs (n=3.55 in the near infrared) enables microlenses 28 to have relatively strong focal power relative to their limited size and curvature. Alternatively or additionally, microlenses 28 may be deposited on surface 30 by an additive process, such as molding of a polymer layer.

In an alternative embodiment (not shown in the figures), VCSELs 22 or other emitters are configured to emit their respective beams away from the surface of the substrate on which they are formed or otherwise mounted. In this case, microlenses 28 are formed over the emitters, rather than on the back surface of the substrate.

As explained further hereinbelow, microlenses 28 have respective sag profiles that vary over the area of substrate 26 such that the microlenses in the central region of the substrate have greater focal power than those in the peripheral region, with focal power of the microlenses decreasing gradually in the radial direction from the center out to the periphery. Furthermore, the sag profiles define respective tilt angles of microlenses 28, which are greater in the peripheral region of the substrate than in the central region. Consequently, outside the central region of substrate 26, microlenses 28 refract the respective beams toward the central axis of projector 20, thus causing the beams to converge. Alternatively, the tilt portion of the sag profile may be reversed, so that the microlenses refract the respective beams in divergent directions.

Projector 20 further comprises projection optics 32, which collimate the beams that have been transmitted through the microlenses. In the present example, projection optics 32 comprise a molded plastic singlet, which has an arbitrarily curved or otherwise non-flat object plane, in accordance with the design and manufacturing limitations of any optical element. The sag profiles of microlenses 28 are chosen such that the respective beams transmitted through the microlenses have respective foci that lie on a geometrical surface 34, as shown in FIG. 1B, which coincides with the object plane of the singlet. (The foci may be virtual foci, which may be located in the interior of substrate 26. In the example shown in FIG. 1B, surface 34 is curved, but alternatively, surface 34 may assume substantially any arbitrary shape.) As a result of matching the shape of the focal surface of the microlens array to the shape of the object plane of projection optics 32, the beams projected by projector 20 have good optical quality, with low divergence, notwithstanding the limited focal power of the microlenses and the field curvature, distortion, and aberrations of the singlet lens.

Figure 3A:
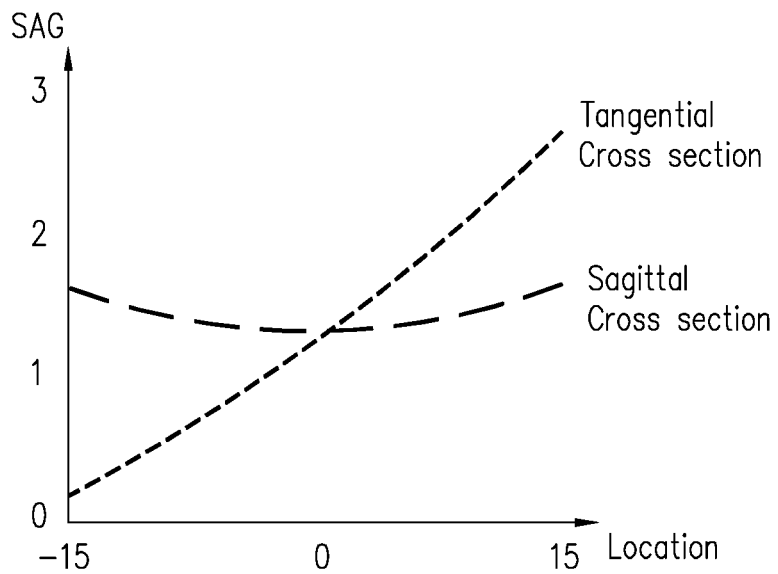
FIGS. 3A and 3B are plots of the sag of the microlens shown in FIG. 2B along tangential and sagittal axes, in accordance with an embodiment of the invention.
Figure 3B:
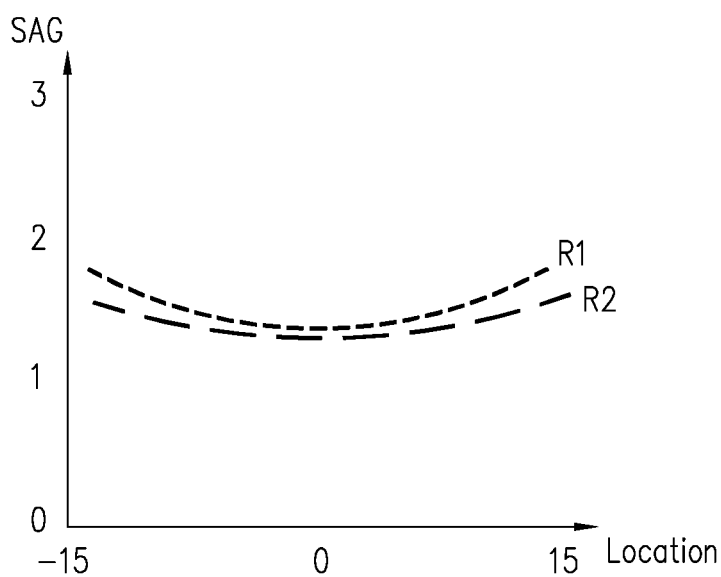

The respective sag profiles of microlenses 28 may further define an astigmatism (as shown in FIG. 3B) that corrects for astigmatism and other aberrations of the projection optics. The astigmatism may be the same in all the microlenses, or it may alternatively vary over the area of substrate 26.

Figure 2A:
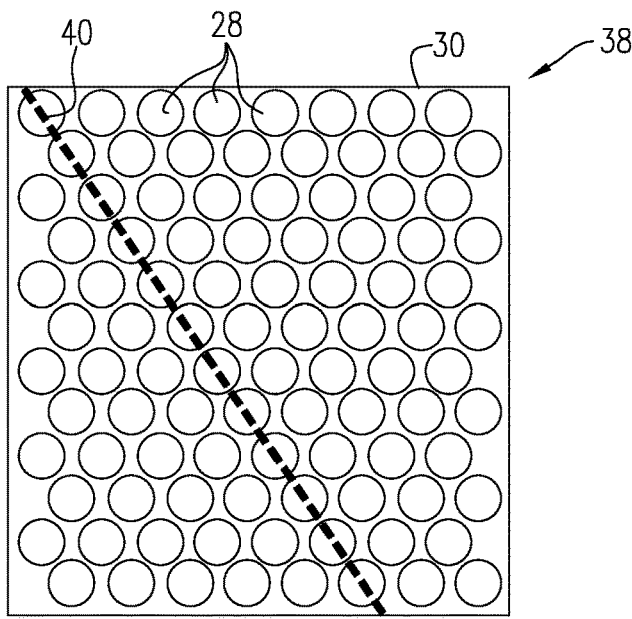
FIG. 2A is a schematic frontal view of a microlens array, in accordance with an embodiment of the invention.
Figure 2B:
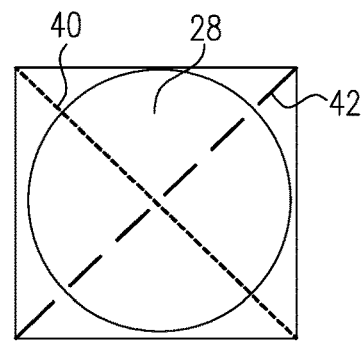
FIG. 2B is a schematic detail view of one of the microlenses in the arrays of FIG. 2A.
Figure 2C:
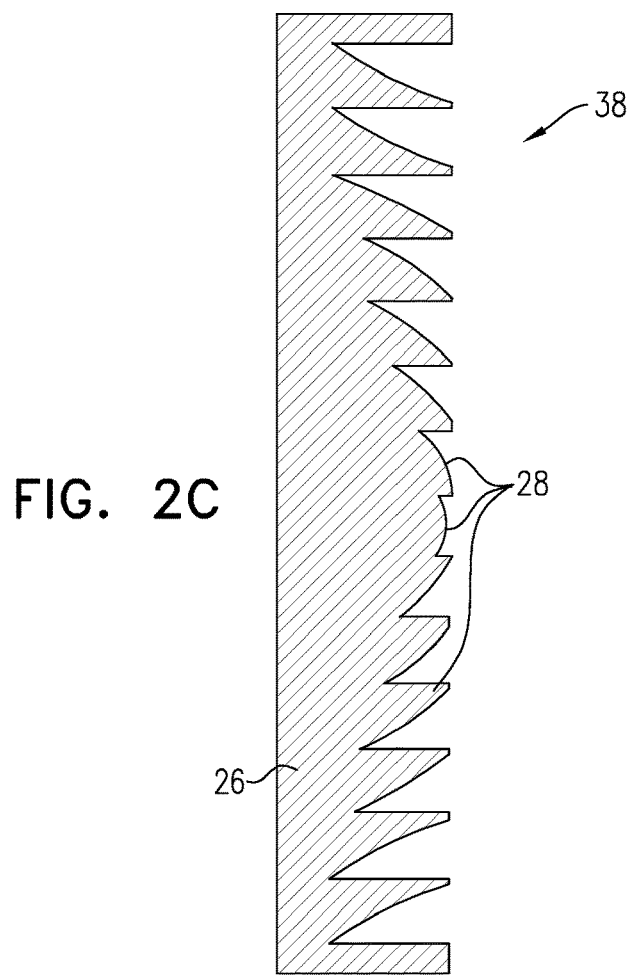
FIG. 2C is a schematic sectional view of the microlens array of FIG. 2A, in accordance with an embodiment of the invention.

Reference is now made to FIGS. 2A-2C, which schematically show details of a microlens array 38, in accordance with an embodiment of the invention. Array 38 may be used in place of the array of microlenses 28 in projector 20 (FIG. 1A) and has similar properties. As in the preceding embodiment, each microlens 28 is aligned with a respective VCSEL (omitted here for the sake of simplicity) on the opposing surface of substrate 26. FIG. 2A is a frontal view of array 38, while FIG. 2C is a sectional view taken along a tangential axis 40 that is shown in FIG. 2A. Although microlenses 28 are arranged in this example in a hexagonal array, other arrangements of the microlenses can also be created in this fashion, including rectilinear and irregular arrays. FIG. 2B is a detail view of one of microlenses 28 in the upper left corner of array 38 in FIG. 2A, showing tangential axis 40 and a sagittal axis 42. (Each microlens will have its own tangential and sagittal axes, depending on the location of the microlens in the array.)

As can be seen in FIG. 2C, microlenses 28 in the central region of array 38 have a positive focal power, i.e., their shape is convex. The focal power decreases gradually with radial distance from the center of the array and turns negative in the peripheral region of substrate 26. The focal power is near zero in the intermediate region between the center and the periphery. Furthermore, the respective tilt angles of microlenses 28 increase from zero at the center of array 38 to ever greater angles with radial distance from the center. (The visual similarity of this sectional view to a Fresnel lens is merely coincidental and has nothing to do with the optical performance of the microlenses in the array.)

As noted earlier, in an embodiment of the present invention, array 38 is formed by gray-scale lithographic etching of a pattern of recesses into surface 30 of a GaAs wafer. The thickness of the wafer is typically about 250 μm, and the maximal depth of the recesses in the present example, at the periphery of array 38, is about 3 μm. The pitch of array 38 and of the corresponding array of VCSELs is 32 μm. The radii of curvature range from +580 μm in the central region to −560 μm at the periphery, and the tilt ranges from 0° in the center to 5.8° in the periphery. (The depths, radii, and tilts of the microlenses are exaggerated in FIG. 2C for the sake of visual clarity.) Although microlenses 28 in the peripheral region are etched deeper into substrate 26, and are thus offset slightly closer to the corresponding VCSELs, than those in the central region, this small offset has very little impact on optical performance.

FIGS. 3A and 3B are plots of the sag of microlens 28 in FIG. 2B along tangential and sagittal axes 40 and 42, in accordance with an embodiment of the invention. In the plot of FIG. 3A, the tangential sag includes the tilt, whereas the tilt is subtracted out in the plot of FIG. 3B. It can thus be seen that microlens 28 is astigmatic, with a radius of curvature of −560 μm along the tangential axis and −530 μm along the sagittal axis. This astigmatism is defined by the non-symmetrical portion of the sag profile. The astigmatism of microlenses 28 varies over the area of array 38 and can thus be designed specifically to correct for the astigmatism of projection optics 32 (FIG. 1A), which tends to increase with radial distance from the optical axis. Additionally or alternatively, the sag profiles of microlenses 28 can be defined to correct for other aberrations of the projection optics, such as spherical aberration and coma. All such corrections are considered to be within the scope of the present invention.

Figure 4:
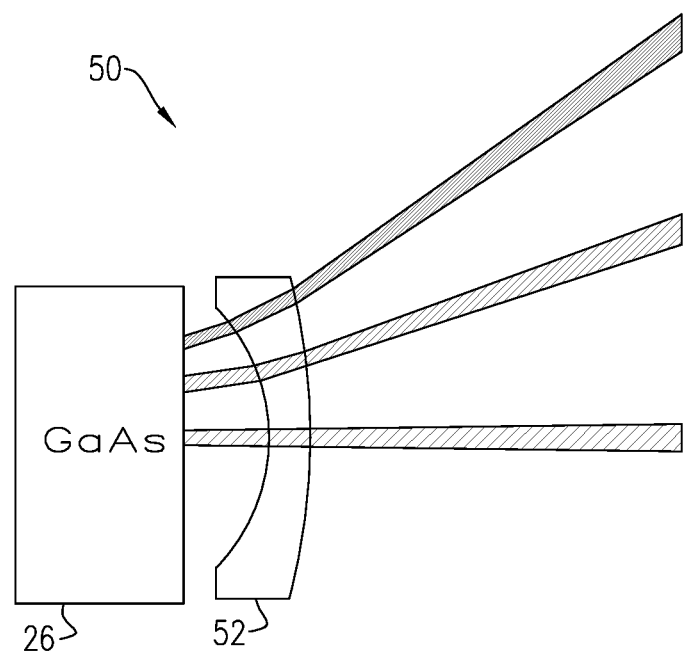
FIG. 4 is a schematic side view of a multi-beam optical projector, in accordance with another embodiment of the invention.

FIG. 4 is a schematic side view of a multi-beam optical projector 50, in accordance with another embodiment of the invention. Projector 50 includes VCSELs 22 and microlenses 28 formed on opposing surfaces of substrate 26, as in the embodiment of FIG. 1 (and omitted here for the sake of simplicity). In this case, however, the sag profiles of the microlenses are defined so that the beams output from substrate 26 diverge. The angular spread of the beams is further increased by a diverging lens 52 in the projection optics. Projector 50 is thus useful in applications in which it is necessary to project a beam pattern over a wide angular range.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
    a first array of emitters disposed on a substrate and configured to emit respective beams of optical radiation in a direction perpendicular to the substrate; and
    a second array of microlenses positioned on the substrate in alignment with the respective beams of the emitters and having respective sag profiles that vary over an area of the substrate, the second array comprising at least first microlenses in a central region of the substrate and second microlenses in a peripheral region of the substrate, such that the first microlenses have respective positive first focal powers, while the second microlenses have respective negative second focal powers.

2. The device according to claim 1, wherein the sag profiles are defined such that the microlenses have respective focal powers that decrease gradually from the first focal powers to the second focal powers in a radial direction over the area of the substrate.

3. The device according to claim 1, wherein the sag profiles define respective tilt angles of the microlenses, and the tilt angles vary over the area of the substrate.

4. The device according to claim 3, wherein the tilt angles are greater in the peripheral region of the substrate than in the central region, whereby the microlenses refract the beams toward a central axis.

5. The device according to claim 1, wherein the substrate comprises a semiconductor chip, which is transparent to the optical radiation emitted by the emitters, and wherein the emitters are disposed on a first surface of the semiconductor chip and emit the respective beams through the substrate, while the microlenses are disposed on a second surface of the semiconductor chip, opposite the first substrate.

6. The device according to claim 5, wherein the microlenses are defined by a pattern of recesses etched into the second surface of the semiconductor chip.

7. The device according to claim 1, wherein the substrate comprises a semiconductor chip, and wherein the emitters are disposed on a surface of the semiconductor chip and emit the respective beams in a direction away from the substrate, while the microlenses are disposed over the emitters.

8. The device according to claim 1, wherein the emitters comprise vertical-cavity surface-emitting lasers (VCSELs).

9. The device according to claim 1, wherein the sag profiles are chosen such that the respective beams transmitted through the microlenses have respective foci that lie on a geometrical surface that is not flat.

10. The device according to claim 9, wherein the geometrical surface is curved.

11. The device according to claim 10, and comprising projection optics having an object plane that is not flat and which coincides with the curved geometrical surface.

12. The device according to claim 11, wherein the projection optics are configured to collimate the beams that have been transmitted through the microlenses.

13. The device according to claim 11, wherein the projection optics comprise a diverging lens.

14. The device according to claim 11, wherein the projection optics comprise a plastic singlet.

15. The device according to claim 1, and comprising projection optics, which are configured to collimate the beams that have been transmitted through the microlenses, and wherein the respective sag profiles define an astigmatism of the microlenses that corrects for an aberration of the projection optics.

16. A method for producing an optical device, the method comprising:
    forming a first array of emitters on a substrate so that the emitters emit respective beams of optical radiation in a direction perpendicular to the substrate; and
    positioning a second array of microlenses on the substrate in alignment with the respective beams of the emitters, the microlenses having respective sag profiles that vary over an area of the substrate, the second array comprising at least first microlenses in a central region of the substrate and second microlenses in a peripheral region of the substrate, such that the first microlenses have respective positive first focal powers, while the second microlenses have respective negative second focal powers.

17. The method according to claim 16, wherein the sag profiles define respective tilt angles of the microlenses, and the tilt angles vary over the area of the substrate.

18. The method according to claim 16, wherein the sag profiles are chosen such that the respective beams transmitted through the microlenses have respective foci that lie on a geometrical surface that is not flat.

19. The method according to claim 16, and comprising configuring projection optics to collimate the beams that have been transmitted through the microlenses, wherein the respective sag profiles define an astigmatism of the microlenses that corrects for an aberration of the projection optics.

* * * * *